(12) United States Patent
Jiang et al.

(10) Patent No.: US 8,314,615 B2
(45) Date of Patent: Nov. 20, 2012

(54) APPARATUS AND METHOD TO IMPROVE MAGNET STABILITY IN AN MRI SYSTEM

(75) Inventors: Longzhi Jiang, Florence, SC (US); John Scaturro, Jr., Florence, SC (US); William Einziger, Florence, SC (US); Yuri Lvovsky, Florence, SC (US); Robbi McDonald, Florence, SC (US); Xiaoxue Diao, Florence, SC (US)

(73) Assignee: General Electric Company, Schenectady, NY (US)

( * ) Notice: Subject to any disclaimer, the term of this patent is extended or adjusted under 35 U.S.C. 154(b) by 458 days.

(21) Appl. No.: 12/644,047

(22) Filed: Dec. 22, 2009

(65) Prior Publication Data
US 2011/0148416 A1 Jun. 23, 2011

(51) Int. Cl.
*G01V 3/00* (2006.01)
(52) U.S. Cl. ........................................................ 324/307
(58) Field of Classification Search ........... 324/300–322
See application file for complete search history.

(56) References Cited

U.S. PATENT DOCUMENTS

| | | | | |
|---|---|---|---|---|
| 4,920,316 A | * | 4/1990 | Egloff | 324/318 |
| 5,220,302 A | * | 6/1993 | Nunnally et al. | 335/301 |
| 5,481,191 A | * | 1/1996 | Rzedzian | 324/318 |
| 5,572,131 A | * | 11/1996 | Rzedzian | 324/318 |
| 5,610,521 A | * | 3/1997 | Zou et al. | 324/318 |
| 6,836,119 B2 | * | 12/2004 | DeMeester et al. | 324/320 |
| 6,954,068 B1 | * | 10/2005 | Takamori et al. | 324/318 |
| 2009/0079430 A1 | | 3/2009 | Yamashita | |

FOREIGN PATENT DOCUMENTS

| | | |
|---|---|---|
| GB | 2307046 A | 5/1997 |
| GB | 2446974 A | 8/2008 |
| JP | 9083022 A | 3/1997 |

OTHER PUBLICATIONS

GB Search Report from corresponding GB Application No. 1020731.4 on Apr. 8, 2011.

* cited by examiner

*Primary Examiner* — Dixomara Vargas
(74) *Attorney, Agent, or Firm* — Ziolkowski Patent Solutions Group, SC

(57) ABSTRACT

An MRI apparatus and method comprises an MRI system having a plurality of gradient coils positioned about a bore of a magnet, and an RF transceiver system and an RF switch controlled by a pulse module to transmit RF signals to an RF coil assembly to acquire MR images. The magnet comprises a main coil former and a shield coil former arranged radially around the bore of the magnet, wherein a radius of the shield coil former is greater than a radius of the main coil former. The magnet also includes at least one main coil affixed to the main coil former, at least one shield coil affixed to the shield coil former, and at least one structural member affixed to the main coil former and to the shield coil former to provide structural support and enable longitudinal alignment adjustment between the main coil former and the shield coil former.

21 Claims, 3 Drawing Sheets

APPARATUS AND METHOD TO IMPROVE MAGNET STABILITY IN AN MRI SYSTEM

BACKGROUND OF THE INVENTION

Embodiments of the invention relate generally to MR imaging systems and, more particularly, to an apparatus and method for adjusting alignment of superconductive main coils and superconductive shield coils of the magnet assembly to prevent magnet inhomogeneity and/or structural failure due to the misalignment.

MR imaging systems are known to employ superconducting magnets for a variety of applications, most notably medical diagnostics and procedures. Known superconducting MRI magnet designs include those having a plurality of superconductive main coils, wherein majority of superconductive main coils each carry an identical electric current in the same direction. In some implementations, individual coils within the main coil assembly may carry current in opposite direction to the majority of the main assembly. These superconductive main coils create a static magnetic field within an MRI imaging volume, the MRI imaging volume typically having a spherical shape centered within the magnet's bore, where the object to be imaged (e.g., a human) is placed.

Due to stray magnetic fields that would originate from the magnet if only the superconductive main coils were present, some type of shielding is generally utilized to prevent the high magnetic field created by and surrounding the superconductive main coils from adversely affecting electronic equipment and other objects in the vicinity of the magnet. One type of shielding, known as passive shielding, uses a cylindrical ferrous shield positioned radially about an outer circumference of the superconductive main coils to prevent the stray magnetic field from "leaking" outside of the machine. However, such passive shielding is unsuitable for many MR system applications, as it greatly increases the size and weight of the machine, making it difficult to construct, transport, and implement in some medical facilities. Another type of shielding, known as active shielding, has been found to have greater applicability in modern MRI systems. Active shielding uses a plurality of superconductive shielding coils carrying electrical currents substantially equal to the electrical currents carried in the superconductive main coils, but in an opposite direction. The superconductive shielding coils are positioned radially about an outer circumference of the superconductive main coils, thereby counteracting the high magnetic field created by and surrounding the superconductive main coils to prevent adverse interaction of electrical equipment or other objects with a stray magnetic field.

Known superconducting magnets with active shielding typically encompass a patient bore in an MR system, with a plurality of main coils and a plurality of shield coils affixed to a single former member. The single former member is configured to be contained within the confines of a helium vessel or other cryogenic liquid vessel, which acts to maintain the temperature of the respective coils at an acceptable level. Unfortunately, however, the necessity to construct the single former member to be structurally capable of supporting the strong opposing forces of shield coils and main coils affixed thereto results in an expensive and labor-intensive magnet construction process.

In an effort to reduce material and construction costs, as well as to increase manufacturing efficiency, magnets having two distinct formers to retain the respective main coils and shield coils have been conceived. However, due to possible imperfections during construction and assembly of two distinct formers within the magnet assembly, some amount of longitudinal misalignment between shield coil former and the main coil former is likely, even if the misalignment is only on the order of several millimeters. Such a misalignment, no matter how small, may cause a non-restoring electromagnetic force in the axial direction, thereby causing a shearing effect between the shield coil former and main coil former. This electromagnetic force grows linearly with the misalignment, which in turn generates a self-amplifying positive feedback. As the misalignment increases, the force continues to grow. In addition to the force implications posed by the misalignment, a substantial final misalignment between the main coil former and the shield former coil may also result in a large magnet inhomogeneity.

It would therefore be desirable to have a system and method capable of reducing misalignment and inhomogeneity between main coil assemblies and shield coil assemblies when the main coils and shield coils are retained on separate respective formers in a superconducting magnet assembly.

BRIEF DESCRIPTION OF THE INVENTION

Embodiments of the invention provide a an MRI apparatus comprising an MRI system having a plurality of gradient coils positioned about a bore of a magnet, and an RF transceiver system and an RF switch controlled by a pulse module to transmit RF signals to an RF coil assembly to acquire MR images. The magnet comprises a main coil former arranged radially around the bore of the magnet, and a shield coil former arranged radially around the bore of the magnet, wherein a radius of the shield coil former is greater than a radius of the main coil former. The magnet also includes at least one main coil affixed to the main coil former, at least one shield coil affixed to the shield coil former, and at least one structural member affixed to the main coil former and to the shield coil former to provide structural support and enable longitudinal alignment adjustment between the main coil former and the shield coil former.

In accordance with another aspect of the invention, a method of constructing a superconducting magnet for an MRI apparatus, wherein the method comprises forming a main coil former having a first radius, and forming a shield coil former having a second radius, the second radius being larger than the first radius. The method further includes affixing at least one main coil to the main coil former, affixing at least one shield coil to the shield coil former, and connecting at least one structural member to the main coil former and to the shield coil former, wherein the at least one structural member configured to allow lateral alignment adjustment between the main coil former and the shield coil former. Additionally, the method includes disposing the main coil former and the shield coil former within a helium vessel.

In accordance with another aspect of the invention, a superconducting magnet comprises a helium vessel, a main coil assembly having a first radius, wherein the main coil assembly comprises at least one main coil retained thereon, and a shield coil assembly having a second radius greater than the first radius, wherein the shield coil assembly comprises at least one shield coil retained thereon. The superconducting magnet also comprises at least one support member coupled to the main coil assembly and the shield coil assembly, the at least one support member configured to structurally support the main coil assembly and the shield coil assembly and to allow linear adjustment between the main coil assembly and the shield coil assembly.

In accordance with yet another aspect of the invention, a superconducting magnet is disclosed, the superconducting magnet comprising at least one main coil configured to generate a main magnetic field in a predetermined region, wherein the at least one main coil is arranged on a main structural former, and at least one shield coil configured to mitigate a stray magnetic field, wherein the at least one shield coil is arranged on a shielding structural former. The superconducting magnet also comprises at least one structural member affixed to the main structural former and the shielding structural former to provide structural support and enable longitudinal alignment adjustment between the main structural former and the shielding structural former, wherein the at least one structural member is configured to have a predetermined mechanical stiffness to suppress instability generated by an electromagnetic force between the main structural former and the shielding structural former due to misalignment between the main structural former and the shielding structural former.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

A system and method are shown to control misalignment between a main coil assembly and a distinct shield coil assembly using at least one structural support member, wherein the structural support member enables alignment adjustment between the main coil assembly and shield coil assembly during manufacture of a superconducting magnet assembly.

Figure 1:
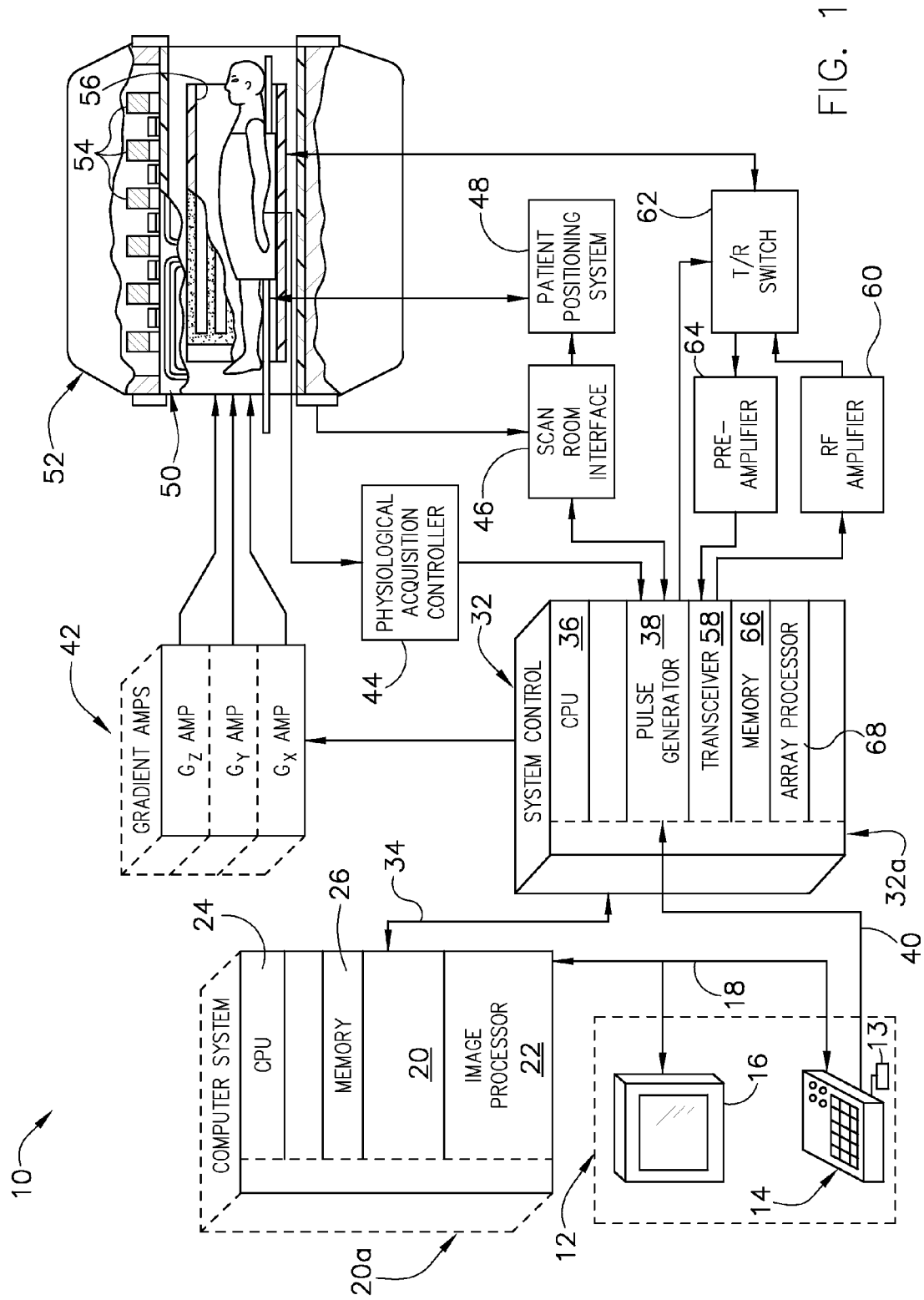
FIG. 1 is a schematic block diagram of an exemplary MR imaging system for use with an embodiment of the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, which may include a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a resonance assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
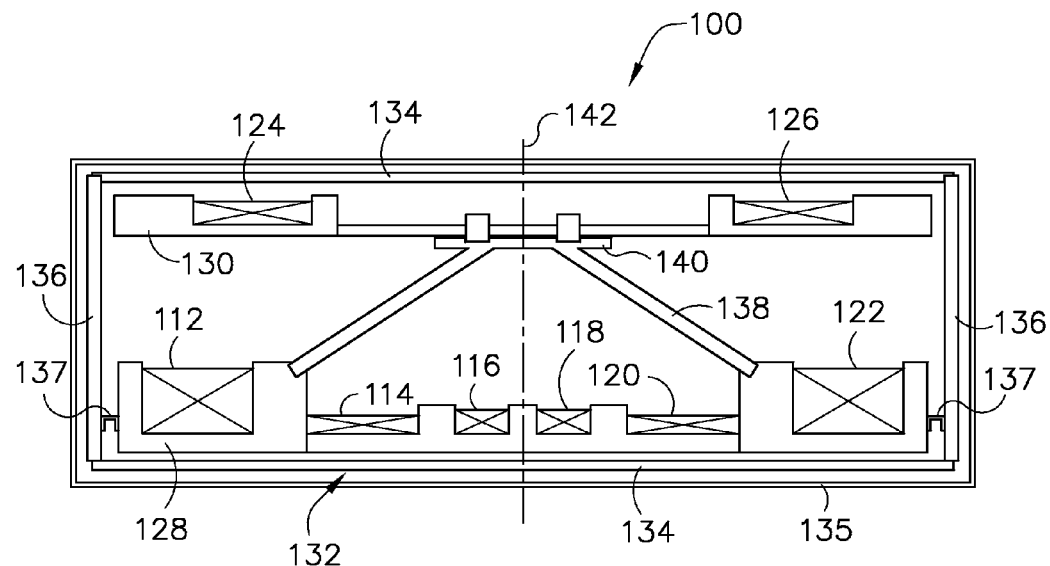
FIG. 2 is a schematic, cross-sectional view of an MR magnet assembly in accordance with an embodiment of the invention.

Referring now to FIG. 2, a superconducting magnet assembly according to an embodiment of the invention is shown. The magnet assembly 100 illustrated in FIG. 2 is a schematic, cross-sectional view of the elements comprising magnet assembly 100. It is to be understood that magnet assembly 100 is typically cylindrical in shape so as to encompass a patient bore of a resonance assembly. However, the invention is not limited to such a configuration. As shown, magnet assembly 100 comprises main coils 112, 114, 116, 118, 120, 122, as well as shield coils 124, 126. Although six main coils and two shield coils are shown in FIG. 2, magnet assembly 100 may incorporate more or fewer main coils and/or shield coils. Main coils 112, 114, 116, 118, 120, 122 are retained on a single main coil former 128, while shield coils 124, 126 are retained on a single shield coil former 130, wherein shield coil former 130 is entirely distinct from main coil former 128 and has a radius greater than that of main coil former 128. Main coil former 128 and shield coil former 130 are each arranged within the confines of a cylindrical cryogenic fluid vessel 132 having respective sidewalls 134 and flanges 136. Cryogenic fluid vessel 132 contains therein liquid helium or another cryogenic fluid to effectively maintain main coils 112, 114, 116, 118, 120, 122 and shield coils 124, 126 at a suitable temperature level during operation. Encompassing cryogenic fluid vessel 132 is a thermal shield 135. Thermal shield 135 acts as a barrier to prevent heat radiating from much higher surrounding temperatures (e.g., 300 K) to the cryogenic fluid vessel 132, which is filled with a cryogenic fluid having a low temperature (e.g., 4.2 K).

As can be seen in FIG. 2, main coil former 128 is mechanically coupled to cryogenic fluid vessel 132 via brackets 137. However, any suitable mechanical coupler may be used to affix main coil former 128 within cryogenic fluid vessel 132. Shield coil former 130 may also be mechanically coupled to cryogenic fluid vessel 132, but according to an exemplary embodiment of the invention, shield coil former 130 is preferably retained within cryogenic fluid vessel 132 simply by way of a structural support member 138. Structural support member 138 is a non-ferrous, non-magnetic (e.g., glass epoxy) structure affixed to both main coil former 128 and shield coil former 130 using screws, nuts, or any other suitable mechanical connectors. Structural support member 138 may be a continuous structure, such as a ring-shaped or conical-shaped structure, which forms an unbroken connection along an entire circumferential surface of both main coil former 128 and shield coil former 130. Alternatively, structural support member 138 may comprise a plurality of discrete conical-shaped structures affixed intermittently along the circumferential surfaces of both main coil former 128 and shield coil former 130. Regardless of whether structural support member 138 is a continuous member or a plurality of discrete members, structural support member 138 operates to both maintain a fixed connection between main coil former 128 and shield coil former 130 and to allow shield coil former 130 to be retained within cryogenic fluid vessel 132 with minimal physical connectivity between shield coil former 130 and cryogenic fluid vessel 132.

While manufacturing two distinct formers (main coil former 128 and shield coil former 130) does reduce the cost and improve the efficiency of producing magnet assembly 100, it may be difficult to sufficiently align the respective formers in the longitudinal direction so as to prevent the shearing forces and magnet inhomogeneity caused by misalignment. That is, if shield coil former 130 is not substantially longitudinally aligned with main coil former 128 about a shared isocenter 142, a non-restoring electromagnetic force in the axial direction is caused due to the opposing forces of main coils 112, 114, 116, 118, 120, 122 and shield coils 124, 126. The shearing effect caused by these forces could be substantial enough to cause structural failure of the components of magnet assembly 100, and could also result in a large magnet inhomogeneity. However, embodiments of the present invention have been conceived to allow for alignment adjustment between main coil former 128 and shield coil former 130, thereby substantially eliminating the threat of structural failure and/or magnet inhomogeneity due to misalignment.

Specifically, referring still to FIG. 2, structural support member 138 is configured to enable longitudinal adjustment of main coil former 128 and/or shield coil former 130 with respect to one another. The amount of allowed longitudinal adjustment is quite small (on the order of several millimeters), but it is large enough for main coil former 128 and shield coil former 130 to be positioned within a region of maximum allowable misalignment ($\delta_{MAX}$) such that any opposing electromagnetic forces due to misalignment do not greatly affect the system. Structural support member 138 enables main coil former 128 and shield coil former 130 to be locked in position using a locking mechanism 140 such that the misalignment does not exceed maximum allowable misalignment $\delta_{MAX}$, thereby ensuring that any shearing forces that exist do not increase with further misalignment to cause structural failure, magnetic inhomogeneity, and/or contact between members of substantially different temperatures (e.g., flanges 136 and thermal shield 135). If any portion of cryogenic fluid vessel 132, such as flanges 132, were to come into contact with thermal shield 135, unwanted heat transfer into cryogenic fluid vessel 132 may occur, which in turn may cause unwanted high pressure and/or boil-off of the cryogenic fluid within cryogenic fluid vessel 132.

In accordance with the present invention, the structural support member 138 is designed in relation to a known maximum allowable misalignment $\delta_{MAX}$. That is, a predetermined stiffness value $k_{ME}$ of structural support member 138 is compared to a magnetic stiffness value $k_{EM}$, where $k_{EM}$ is dependent upon the specific magnetic characteristics of magnet assembly 100 (e.g., the current level supplied to each of main coils 112, 114, 116, 118, 120, 122 and shield coils 124, 126). Structural support member 138 is designed such that its mechanical stiffness value $k_{ME}$ is greater than the magnetic stiffness value $k_{EM}$ of the system (i.e., the ratio of $k_{ME}/k_{EM}$ is greater than one). Using these known values $k_{ME}$ and $k_{EM}$, a determination can be made whether the structural support member 138 is capable of maintaining sufficient alignment between main coil former 128 and shield coil former 130, as will be set forth in further detail below.

During production of magnet assembly 100, structural support member 138 is attached to both main coil former 128 and shield coil former 130, with main coil former 128 and shield coil former 130 being substantially aligned relative to one another along isocenter 142. A initial controlled misalignment $\delta_I$ can then be determined by supplying a current to each of main coils 112, 114, 116, 118, 120, 122 and shield coils 124, 126 and producing a magnetic map therefrom. From measured initial controlled misalignment $\delta_I$, a final misalignment $\delta_F$ is able to be determined using the following equation:

$$\delta_F = \delta_I/(1-(k_{EM}/k_{ME})) = \delta_I(1+(1/((k_{ME}/k_{EM})-1))) \quad \text{(Eqn. 1)}$$

If predetermined stiffness value $k_{ME}$ of structural support member 138 is sufficient, the final misalignment $\delta_F$ after amplification will not exceed the maximum allowable misalignment $\delta_{MAX}$. Thus, based on the above equation, the relative positions of main coil former 128 and shield coil former 130 are longitudinally adjusted with respect to one another such that their misalignment does not exceed maximum allowable misalignment $\delta_{MAX}$. Main coil former 128 and shield coil former 130 are then locked in place using locking mechanism 140 of structural support member 138. In this way, misalignment between main coil former 128 and shield coil former 130 during operation of magnet 100 is controlled such that structural failure and/or magnetic inhomogeneity are avoided.

Figure 3:
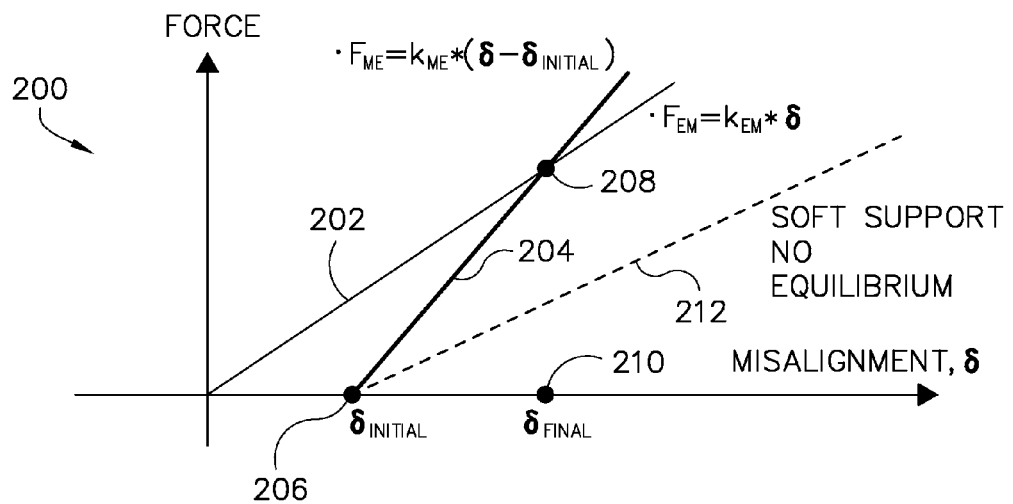
FIG. 3 is a graph depicting force versus misalignment in accordance with an embodiment of the invention.

Referring now to FIG. 3, a graphical representation in accordance with the present invention is shown. Graph 200 illustrates force versus misalignment (δ) in a magnet assembly having a structural support member, similar to that which is described above with respect to FIG. 2. Line 202 represents the electromagnetic force $F_{EM}$, which increases as relative misalignment δ between a main coil assembly and a shield coil assembly increases. In particular, electromagnetic force $F_{EM}$ is determined by the following equation:

$$F_{EM} = k_{EM} \cdot \delta \quad \text{(Eqn. 2)}$$

Similarly, line 204 represents the counteracting mechanical force $-F_{ME}$, wherein the counteracting force $-F_{ME}$ also increases as relative misalignment δ between a main coil assembly and a shield coil assembly increases. Mechanical force $-F_{ME}$ is determined using the following equation:

$$-F_{ME} = k_{ME} \cdot (\delta - \delta_{INITIAL}) \quad \text{(Eqn. 3)}$$

As can be seen by Eqn. 3, the value of the counteracting mechanical force $-F_{ME}$ is dependent upon the mechanical stiffness value $k_{ME}$ of the structural support member chosen for the given magnet assembly.

Due to an initial misalignment $\delta_{INITIAL}$ between the main coil assembly and shield coil assembly, measurement of counteracting mechanical force $-F_{ME}$ begins at point 206 related to initial misalignment $\delta_{INITIAL}$, rather than at the origin, where measurement of electromagnetic force $F_{EM}$ begins. As such, electromagnetic force $F_{EM}$ is initially greater than counteracting mechanical force $-F_{ME}$, thereby leading to increased misalignment, even with a counteracting mechanical structure (i.e., a structural support member) present in the system. However, as mechanical stiffness value $k_{ME}$ is ideally greater than the magnetic stiffness value $k_{EM}$ of the system, line 202 and line 204 will eventually intersect at an equilibrium point 208. This equilibrium point 208 coincides with the point of final misalignment $\delta_{FINAL}$ 210, where counteracting mechanical force $-F_{ME}$ is equal to electromagnetic force $F_{EM}$. As long as final misalignment $\delta_{FINAL}$ is not greater than the maximum allowable misalignment $\delta_{MAX}$, the structural support member having mechanical stiffness value $k_{ME}$ is sufficient for maintaining stability in the magnet assembly. If, however, the mechanical stiffness value $k_{ME}$ is less than the magnetic stiffness value $k_{EM}$, no equilibrium point will be reached, and the system will not be stable. Line 212 in FIG. 3 illustrates an instance where the mechanical stiffness value $k_{ME}$ is less than the magnetic stiffness value $k_{EM}$. It can easily be seen that misalignment will continue to grow under such a configuration, thereby leading to "runaway instability", with excessive misalignment resulting in possible structural failures, magnet inhomogeneity, and/or contact between members of substantially different temperatures, thereby causing unwanted heat transfer into the cryogenic vessel, as disclosed above.

While the above examples relate to maximum allowable misalignment, it is also important for the structural support member of the magnet assembly to be designed in view of the maximum allowable inhomogeneity of the MRI magnet prior to shimming. Specifically, an amplification factor amp of the system is determined using the following equation:

$$amp = 1/(1 - (k_{EM}/k_{ME})) \quad \text{(Eqn. 4)}$$

As long as amplification factor amp is greater than a predetermined amplification value derived from the maximum allowable inhomogeneity of the magnet assembly, the stability of the system will be maintained. Once again, the mechanical stiffness value $k_{ME}$ is critical in determining an acceptable amplification factor amp, and thus the structural support member of the system is designed with both the maximum allowable misalignment and the maximum allowable inhomogeneity in mind.

Figure 4:
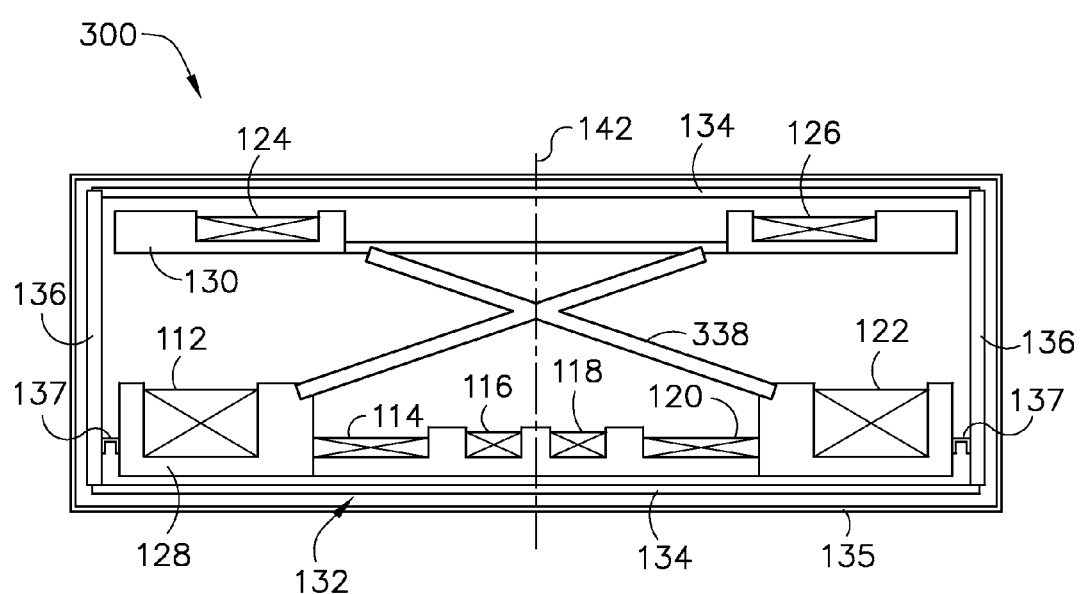
FIG. 4 is a schematic, cross-sectional view of an MR magnet assembly in accordance with another embodiment of the invention.

FIG. 4 illustrates another embodiment in accordance with the invention. Magnet assembly 300 illustrated in FIG. 4 is a schematic, cross-sectional view of the elements comprising magnet assembly 300. The elements of magnet assembly 300 are substantially similar to those disclosed with respect to magnet assembly 100 shown in FIG. 2. As such, the related components between magnet assembly 100 and magnet assembly 300 are shown with identical reference numerals, and their functions will not be repeated herein.

As FIG. 4 shows, main coil former 128 and shield coil former 130 are connected to one another via a structural support member 338. Like structural support member 138 described above with respect to FIG. 2, structural support member 338 is composed of at least one non-ferrous, non-magnetic (e.g., glass epoxy) structure affixed to both main coil former 128 and shield coil former 130 using screws, nuts, or any other suitable mechanical connectors. However, unlike structural support member 138, structural support member 338 comprises a plurality of distinct truss structures which are affixed intermittently along the circumferential surface of both main coil former 128 and shield coil former 130. The distinct truss structures that form structural support member 338 operate to both maintain a fixed connection between main coil former 128 and shield coil former 130 and to allow shield coil former 130 to be retained within cryogenic fluid vessel 132 with minimal physical connectivity between shield coil former 130 and cryogenic fluid vessel 132 itself.

While the above embodiments each describe the use of cryogenic fluid vessel filled with a cryogenic fluid to regulate the temperature of the magnet assembly, it is to be understood that the present invention is not limited to such cryogenic cooling. That is, embodiments of the present invention would also apply to a conduction-cooled superconducting magnet assembly (i.e., a "dry" magnet). Furthermore, it is also envisioned that the present invention may be utilized for any shielded magnet application, and thus the present invention is not limited to MR imaging systems.

Thus, in accordance with one aspect of the invention, an MRI apparatus comprises an MRI system having a plurality of gradient coils positioned about a bore of a magnet, and an RF transceiver system and an RF switch controlled by a pulse module to transmit RF signals to an RF coil assembly to acquire MR images. The magnet comprises a main coil former arranged radially around the bore of the magnet, and a shield coil former arranged radially around the bore of the magnet, wherein a radius of the shield coil former is greater than a radius of the main coil former. The magnet also includes at least one main coil affixed to the main coil former, at least one shield coil affixed to the shield coil former, and at least one structural member affixed to the main coil former and to the shield coil former to provide structural support and enable longitudinal alignment adjustment between the main coil former and the shield coil former.

In accordance with another aspect of the invention, a method of constructing a superconducting magnet for an MRI apparatus is disclosed, wherein the method comprises forming a main coil former having a first radius, and forming a shield coil former having a second radius, the second radius being larger than the first radius. The method further includes affixing at least one main coil to the main coil former, affixing at least one shield coil to the shield coil former, and connecting at least one structural member to the main coil former and to the shield coil former, wherein the at least one structural member configured to allow lateral alignment adjustment between the main coil former and the shield coil former. Additionally, the method includes disposing the main coil former and the shield coil former within a helium vessel.

In accordance with another aspect of the invention, a superconducting magnet comprises a helium vessel, a main coil assembly having a first radius, wherein the main coil assembly comprises at least one main coil retained thereon, and a shield coil assembly having a second radius greater than the first radius, wherein the shield coil assembly comprises at least one shield coil retained thereon. The superconducting magnet also comprises at least one support member coupled to the main coil assembly and the shield coil assembly, the at least one support member configured to structurally support the main coil assembly and the shield coil assembly and to allow linear adjustment between the main coil assembly and the shield coil assembly.

In accordance with yet another aspect of the invention, a superconducting magnet is disclosed, the superconducting magnet comprising at least one main coil configured to generate a main magnetic field in a predetermined region, wherein the at least one main coil is arranged on a main structural former, and at least one shield coil configured to mitigate a stray magnetic field, wherein the at least one shield coil is arranged on a shielding structural former. The superconducting magnet also comprises at least one structural member affixed to the main structural former and the shielding structural former to provide structural support and enable longitudinal alignment adjustment between the main structural former and the shielding structural former, wherein the at least one structural member is configured to have a predetermined mechanical stiffness to suppress instability generated by an electromagnetic force between the main structural former and the shielding structural former due to misalignment between the main structural former and the shielding structural former.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An MRI apparatus comprising:
    a magnetic resonance imaging (MRI) system having a plurality of gradient coils positioned about a bore of a magnet, and an RF transceiver system and an RF switch controlled by a pulse module to transmit RF signals to an RF coil assembly to acquire MR images, wherein the magnet comprises:
    a main coil former arranged radially around the bore of the magnet;
    a shield coil former arranged radially around the bore of the magnet, wherein a radius of the shield coil former is greater than a radius of the main coil former;
    at least one main coil affixed to the main coil former;
    at least one shield coil affixed to the shield coil former; and
    at least one structural member affixed to the main coil former and to the shield coil former to provide structural support and enable longitudinal alignment adjustment between the main coil former and the shield coil former.

2. The MRI apparatus of claim 1 wherein the at least one structural member comprises a structurally continuous member radially disposed between the main coil former and the shield coil former.

3. The MRI apparatus of claim 2 wherein the continuous member comprises one of a ring-shaped structure and conical-shaped structure.

4. The MRI apparatus of claim 1 wherein the at least one structural member comprises a plurality of discrete members radially disposed between the main coil former and the shield coil former.

5. The MRI apparatus of claim 4 wherein the plurality of discrete members comprise a plurality of truss structures affixed to the main coil former and the shield coil former at a plurality of different locations.

6. The MRI apparatus of claim 1 wherein the at least one structural member comprises a locking mechanism configured to prevent longitudinal movement of the main coil former with respect to the shield coil former when the main coil former and the shield coil former are longitudinally aligned.

7. The MRI apparatus of claim 1 wherein a mechanical stiffness value of the at least one structural member is determined based on a magnetic stiffness value between the main coil former having the at least one main coil affixed thereon and the shield coil former having the at least one shield coil affixed thereon.

8. The MRI apparatus of claim 1 further comprising a cryogenic fluid vessel, wherein the main coil former is affixed to the cryogenic fluid vessel to support the at least one structural member and the shield coil former within the cryogenic fluid vessel.

9. The MRI apparatus of claim 8 wherein the cryogenic fluid vessel is a helium vessel configured to contain liquid helium therein.

10. The MRI apparatus of claim 1 wherein the at least one structural member is formed of a non-ferrous, non-magnetic material.

11. A method of constructing a superconducting magnet for an MRI apparatus, the method comprising:
    forming a main coil former having a first radius;
    forming a shield coil former having a second radius, the second radius being larger than the first radius;
    affixing at least one main coil to the main coil former;
    affixing at least one shield coil to the shield coil former;
    connecting at least one structural member to the main coil former and to the shield coil former, the at least one structural member configured to allow lateral alignment adjustment between the main coil former and the shield coil former; and
    disposing the main coil former and the shield coil former within a helium vessel.

12. The method of claim 11 further comprising adjusting a position of at least one of the main coil former and the shield coil former based on a maximum allowable longitudinal misalignment between the main coil former and the shield coil former.

13. The method of claim 12 further comprising determining the maximum allowable longitudinal misalignment based on a predetermined mechanical stiffness value of the at least one structural member and a magnetic stiffness value between the main coil former having the main coil thereon and the shield coil former having the shield coil thereon.

14. The method of claim 12 further comprising locking the at least one structural member in place on at least one of the main coil former and the shield coil former at the point of maximum allowable longitudinal misalignment.

15. The method of claim 12 further comprising affixing at least one of the main coil former and the shield coil former to the helium vessel.

16. A superconducting magnet comprising:
a helium vessel;
a main coil assembly having a first radius, wherein the main coil assembly comprises at least one main coil retained thereon;
a shield coil assembly having a second radius greater than the first radius, wherein the shield coil assembly comprises at least one shield coil retained thereon; and
at least one support member coupled to the main coil assembly and the shield coil assembly, the at least one support member configured to structurally support the main coil assembly and the shield coil assembly and to allow linear adjustment between the main coil assembly and the shield coil assembly.

17. The superconducting magnet of claim 16 wherein the main coil assembly is attached to at least one flange of the helium vessel using at least one bracket.

18. The superconducting magnet of claim 16 wherein the at least one support member is formed of one of a continuous ring-shaped structure and a continuous conical-shaped structure.

19. The superconducting magnet of claim 16 wherein the at least one support member is formed of a plurality of discrete truss structures affixed to the main coil assembly and the shield coil assembly at a plurality of different locations.

20. The superconducting magnet of claim 16 wherein the at least one support member comprises a locking mechanism thereon, the locking mechanism operable to prevent linear adjustment between the main coil assembly and the shield coil assembly.

21. A superconducting magnet comprising:
at least one main coil configured to generate a main magnetic field in a predetermined region, wherein the at least one main coil is arranged on a main structural former;
at least one shield coil configured to mitigate a stray magnetic field, wherein the at least one shield coil is arranged on a shielding structural former; and
at least one structural member affixed to the main structural former and the shielding structural former to provide structural support and enable longitudinal alignment adjustment between the main structural former and the shielding structural former, wherein the at least one structural member is configured to have a predetermined mechanical stiffness to suppress instability generated by an electromagnetic force between the main structural former and the shielding structural former due to misalignment between the main structural former and the shielding structural former.

* * * * *